United States Patent [19]

Roche

[11] Patent Number: 4,481,706

[45] Date of Patent: Nov. 13, 1984

[54] PROCESS FOR MANUFACTURING INTEGRATED BI-POLAR TRANSISTORS OF VERY SMALL DIMENSIONS

[75] Inventor: Marcel Roche, Paris, France

[73] Assignee: Thomson-CSF, Paris, France

[21] Appl. No.: 392,366

[22] Filed: Jun. 25, 1982

[30] Foreign Application Priority Data

Jun. 26, 1981 [FR] France ................................ 81 12604

[51] Int. Cl.³ ................ H01L 21/265; H01L 21/302; H01L 21/283

[52] U.S. Cl. ............................... 29/577 C; 29/576 E; 29/578; 29/590; 29/591; 148/1.5; 148/174; 148/175; 148/188; 156/628; 156/643; 156/653; 156/657; 357/20; 357/50; 357/59; 357/91

[58] Field of Search ................ 29/576 E, 577 C, 578, 29/590, 591; 148/174, 175, 1.5, 188, 187; 156/628, 643, 653, 657; 357/20, 49, 50, 59, 91

[56] References Cited

U.S. PATENT DOCUMENTS 4,209,349 6/1980 Ho et al. ........................... 156/653 X
4,319,932 3/1982 Jambotkar ............................ 148/1.5

FOREIGN PATENT DOCUMENTS 2389236 11/1978 France .

OTHER PUBLICATIONS

Nakashiba et al., "Advanced PSA Technology . . . Bipolar LSI", IEEE Trans. on Electron Devices, vol. ED-27, No. 8, Aug. 1980, pp. 1390–1394.

Antipov, I., "Undercut Contacts for Poly Si Base", I.B.M. Tech. Discl. Bull., vol. 22, No. 8B, Jan. 1980, pp. 3693–3694.

Yeh, T. H., "Self-Aligned Integrated . . . Structures", IBM Tech. Discl. Bull., vol. 22, No. 9, Feb. 1980, pp. 4047–4051.

*Primary Examiner*—William G. Saba
*Attorney, Agent, or Firm*—Cushman, Darby & Cushman

[57] ABSTRACT

A process is provided for manufacturing bi-polar transistors integrated on silicon. To form transistors of very small dimensions, a layer of polycrystalline silicon is deposited (after a localized oxidization step) which is etched and which is doped so as to serve as doping source for P+ extrinsic base regions of the transistor. After doping of the P intrinsic base, the oxide and/or nitride is then deposited at low pressure which is implanted with an impurity facilitating dissolution thereof. On the vertical walls of the polycrystalline silicon around the base, the nitride is not dissolved. Elsewhere it is easily dissolved. Advantage is taken of the oxide or nitride thickness which remains to form by diffusion of an N+ emitter region which will not extend laterally as far as the P+ type extrinsic base but which will allow to remain an intrinsic base of very small thickness. The emitter diffusion may take place through a second polycrystalline silicon layer.

11 Claims, 12 Drawing Figures

PROCESS FOR MANUFACTURING INTEGRATED BI-POLAR TRANSISTORS OF VERY SMALL DIMENSIONS

BACKGROUND OF THE INVENTION

The present invention relates to technologies for manufacturing integrated circuits, on a silicon substrate, incorporating bipolar transistors of very small dimensions.

For reasons of integration density and also for reasons of operating rapidity, efforts are made to produce bipolar transistors as small as possible and having more especially a small emitter surface, a small base thickness and a small distance between the emitter and the base contact. In so far as this latter point is concerned, it follows from the requirement of reducing the access resistance to the base between the base contact and the base properly speaking. This resistance could be reduced by increasing the doping of the base, but that would lead to a very poor current gain for the transistor.

Thus, in order to produce transistors with a good performance, the base region is broken down into two parts: an intrinsic lightly doped base region, immediately adjacent the emitter region, and an extrinsic base region, more heavily doped, adjacent the intrinsic base region and covered by a base contact. The intrinsic base region must have as small a thickness as possible and the base contact must come as close as possible to the emitter, while obviously avoiding any contact with the emitter. In addition, the extrinsic base region must not come into contact with the emitter region: short-circuiting of the transistor would result because of a poor junction. These requirements, applied to emitter dimensions of the order of a micron, entail extremely accurate etching and doping techniques while using, as much as possible, self-alignment processes for eliminating the risks of error due to the inaccurate super-imposition of successive etching masks.

Techniques have already been proposed for manufacturing very small sized transistors, with an intrinsic lightly doped base and an extrinsic more heavily doped base, using two layers of polycrystalline silicon which provide self-alignment of the base contact and the extrinsic base region, as well as self-alignment of the emitter contact with the emitter region.

The present invention proposes a new manufacturing process which retains the advantages of these two alignments and which further allows self-alignment of the emitter region with respect to the intrinsic and extrinsic base regions and so with respect to the base contact.

SUMMARY OF THE INVENTION

In the process of the invention, the steps of forming the base and the emitter of the bipolar transistor comprise:

(a) formation, on a monocrystalline silicon layer of a first type of conductivity, of a polycrystalline silicon layer, doped above the base region with an impurity of a second type of conductivity, (b) formation of an insulating layer on the polycrystalline silicon, (c) elimination of the insulating layer and of the polycrystalline silicon above a region which will form an intrinsic base of the transistor, (d) heat treatment ensuring diffusion in the monocrystalline silicon of the impurity of the second type present in the polycrystalline silicon, so as to form an extrinsic base region surrounding the intrinsic base region, (e) doping of the monocrystalline silicon in the intrinsic base region with an impurity of the second type of conductivity, (f) uniform deposition, in low pressure vapor phase, of a small thickness of oxide and/or silicon nitride, (g) vertical ionic implantation, in the evenly deposited oxide or nitride, of an impurity capable of increasing the dissolvability of the oxide and/or of the nitride, (h) dissolution of the oxide and/or nitride for a period of time sufficiently long to lay bare the monocrystalline silicon in the center of the intrinsic base region but not long enough to eliminate the oxide or nitride on the vertical edges of the polycrystalline silicon, where the impurities have not penetrated into the oxide or the nitride, and not long enough to lay bare the polycrystalline silicon where it is covered, in addition to the oxide and the nitride, with an insulating layer formed in step (b), (i) doping, with an impurity of the first type of conductivity, of the monocrystalline silicon region which has been laid bare before or after deposition and etching of a conducting emitter contact in this region, so as to form an emitter region self-aligned with its contact.

The conducting emitter connection is preferably a second polycrystalline silicon layer through which is diffused an impurity of the first conductivity type so as to form an emitter region self-aligned with its contact.

The silicon nitride and oxide which remain, after chemical etching, on the vertical polycrystalline silicon edges surrounding the emitter region, define a thickness corresponding substantially to the thickness of the intrinsic base. On one side of this thickness is to be found the first polycrystalline silicon layer which forms a base contact self-aligned with the intrinsic base region, on the other is to be found the emitter contact self-aligned with the emitter region. The oxide or nitride thickness remaining after chemical etching establishes the self-alignment sought between emitter and base contact.

BRIEF DESCRIPTION OF THE DRAWINGS

Other features and advantages of the invention will appear from the detailed description which follows which is given with reference to the acompanying drawings in which.

Figure 1:
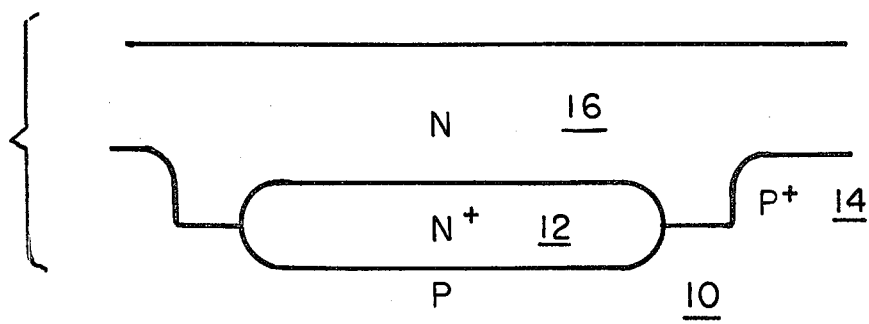
FIGS. 1 to 12 show the succession of the main steps for manufacturing a bipolar transistor in accordance with the invention.

The dimensions of the sectional drawings are substantially to scale so as to better understand the process and its results.

DESCRIPTION OF THE PREFERRED EMBODIMENT

Starting with a silicon substrate 10 doped with an impurity of a first conductivity type, for example P (resistivity of the order of 3 to 20 ohms-centimeter), regions of the substrate are doped in a conventional way with an impurity of the opposite type (N), which regions will form a buried heavily doped N+ type layer 12 below each of the subsequently formed transistors.

Preferably, around each buried layer region 12, concentrated over-doping is effected with a P type impurity in the substrate so as to serve as a foundation for junction insulating regions 14 between transistors.

These foundations are formed by boron implantation, for example with an energy of 180 kev and a dose of the order of $3 \times 10^{14}$ At/cm$^2$, thus causing an epitaxial layer 16 to grow of N type monocrystalline silicon (lightly doped) having a thickness of about 2 microns and a resistivity of 0.5 ohm/cm.

During epitaxial growth and during subsequent heat treatment steps, the N+ type impurities diffused in the substrate and the P+ type impurities, implanted in the insulating foundations, rise by diffusion into the epitaxial layer and form respectively the buried layer regions 12 (N+) and the junction insulating regions 14 (P+).

The insulating regions 14 could be diffused from the top after epitaxial growth but the advantage of diffusion from the bottom from P+ foundations is, on the one hand, to take advantage of the heat treatment of the epitaxy so as to ensure the upward rise of the P+ impurities and, on the other hand, to facilitate the optical locating of the mask of the insulating regions with respect to the buried layers since these latter are not masked by the epitaxial layer during formation of the P+ foundations.

FIG. 1 shows the substrate at this step.

Figure 2:
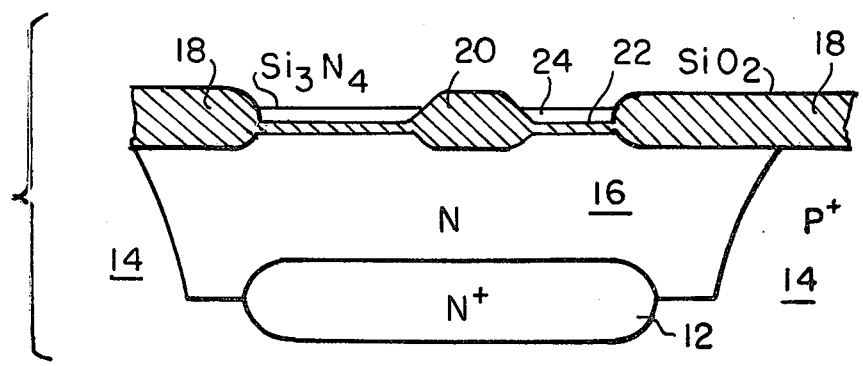

The insulation between transistors is completed by localized oxidation of the surface of the epitaxial layer 16 (FIG. 2). This localized oxidation serves to form a thick surface oxide region 18 all around each transistor, above the junction insulating region 14 which also surrounds the active zone in which each transistor is formed. The insulation of the active zones with respect to each other results from the combination of regions 18 (thick oxide insulation) and 14 (junction insulation).

In this localized oxidation step, thick oxide regions 20 are also formed separating, in each active zone, a base region (on the left in FIG. 2), from a collector region (on the right).

The localized oxidation is achieved conventionally by formation of a layer 22 of thermal silicon oxide SiO$_2$ (about 300 angströms) on the surface of the silicon wafer such as it appears in FIG. 1, i.e. on the surface of epitaxial layer 12. Then, a layer 24 of silicon nitride (Si$_3$N$_4$) of about 1000 angströms is deposited. The nitride is etched at the locations of the desired thick oxide zones (18 and 20). Then thermal oxidation is carried out, which only occurs where there is no nitride, until an oxide thickness is obtained of about a micron in the insulating regions 18 and 20. This thick oxide is called field oxide.

The nitride and the fine oxide layer 22 are eliminated and a uniform layer of polycrystalline silicon 26 having a thickness of about 5000 angströms is deposited in low pressure vapor phase.

Again localized oxidation is carried out, this time in the polycrystalline silicon so as to form thick oxide regions 28 which interrupt the polycrystalline silicon layer 26 and which allow a base electrode (on the left of the figure) and a collector electrode (on the right) to be separated for each transistor, and which also allows a pattern of polycrystalline silicon resistive interconnections to be defined between certain transistors, depending on the circuit to be produced.

Figure 3:
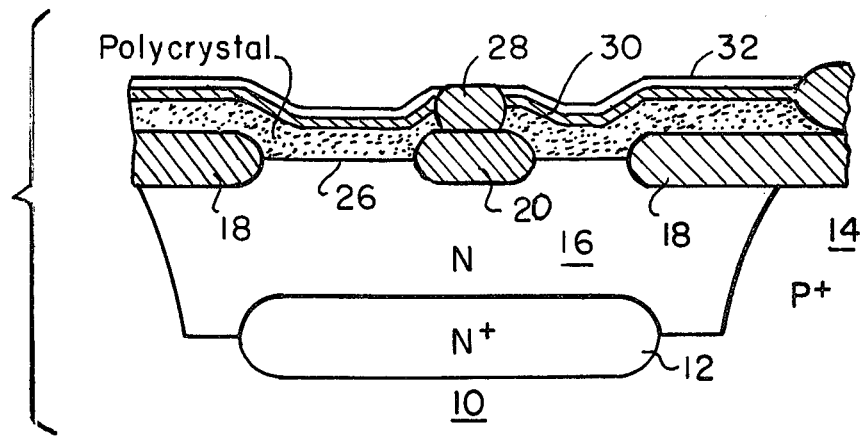

It should be noted that in FIG. 3, which represents the second localized oxidation step, shown is a thick oxide region 28 formed above the oxide region 20 which defined the base portion of the collector part of each transistor.

The second localized oxidation is carried out substantially like the first one, for example with a silicon oxide layer 30 of about 3000 angströms covered over with a nitride layer 32 of about 600 angströms; this nitride is etched, and then thermal oxidation is carried out so as to oxidize over the whole of its height the polycrystalline silicon in the regions 28 not protected by the nitride.

Figure 4:
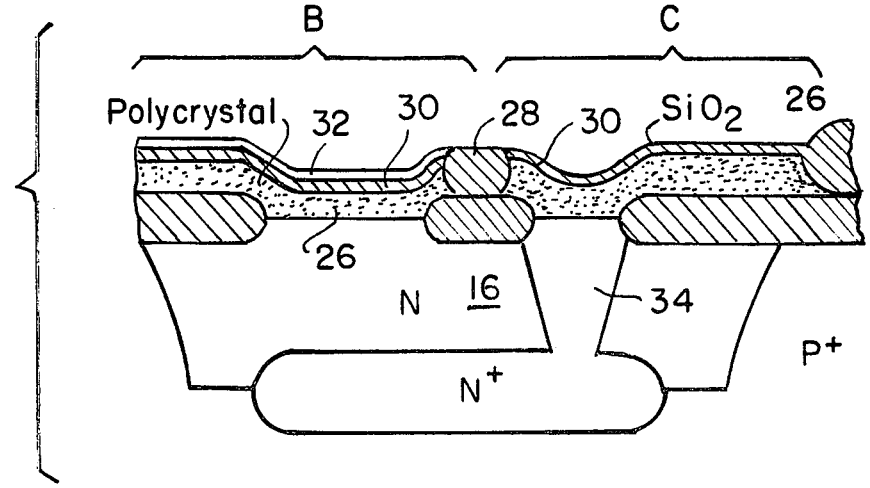

With the help of a selection mask, i.e. a mask which does not require design accuracy or, especially, an extremely high positioning accuracy, the nitride is eliminated at the level of the collector electrodes and interconnections (polycrystalline silicon regions C in FIG. 4). Plasma or a chemical solution may be used to effect elimination of the nitride by etching.

A phosphorous dope is deposited and, by means of heat treatment, if diffuses into the polycrystalline silicon of the C regions where there is no nitride and, where the polycrystalline silicon is in contact with the monocrystalline silicon, the phosphorous also diffuses into the latter.

Thus, not only a collector electrode and heavily doped (and therefore not very resistive) interconnections are formed, but also formed is an N+ type region 34 which is an access well to the buried layer 12.

The nitride is eliminated in the same way above the base regions (part B of FIG. 4) and, after masking the C regions with a resin, boron is implanted in the polycrystalline silicon which is not protected by the resin. The polycrystalline silicon thus doped by implantation will subsequently serve as a P type doping source for the monocrystalline silicon.

The implantation may be carried out several times so as to distribute the implanted dose with several energies and so as to have thus doping over the whole thickness of layer 26.

For example, $2 \times 10^{15}$ atoms/cm$^2$ will be implanted at 100 kev, then the same dose at 140 kev, then again the same dose at 180 kev. These implantations are followed by annealing at 900° C. for 25 minutes in a nitrogen atmosphere, so as to make uniform the doping in the polycrystal.

Instead of depositing the non-doped polycrystalline silicon and then doping with phosphorous in the C regions and implanting boron in the B regions, polycrystalline silicon doped with boron could be deposited (doping at the same time as the deposition). If it is desired to form a deep N+ type diffusion for the access well to the collector (34), the C regions are doped with phosphorous with a sufficient dose to overcompensate the boron dose present in the polycrystalline silicon. If there is no need for a deep diffusion 34, it may be provided for the collector contact to be made not by the polycrystalline silicon layer 26 but by a second polycrystalline silicon layer deposited subsequently and serving in any case, as will be seen further on, to form an N+ type doped emitter contact. In this case, the polycrystalline silicon of layer 26 is eliminated from region C before the second polycrystalline silicon layer is deposited.

Figure 5:
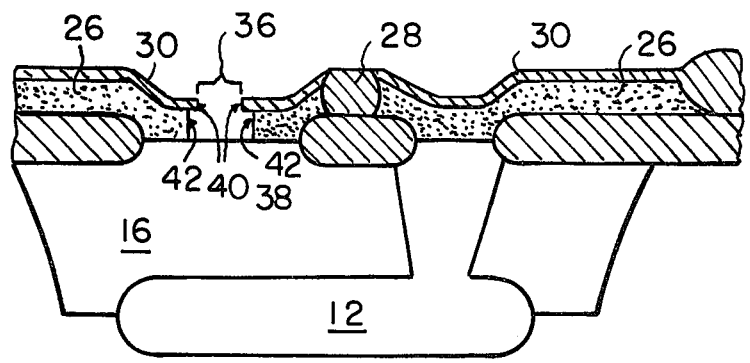
Figure 6:
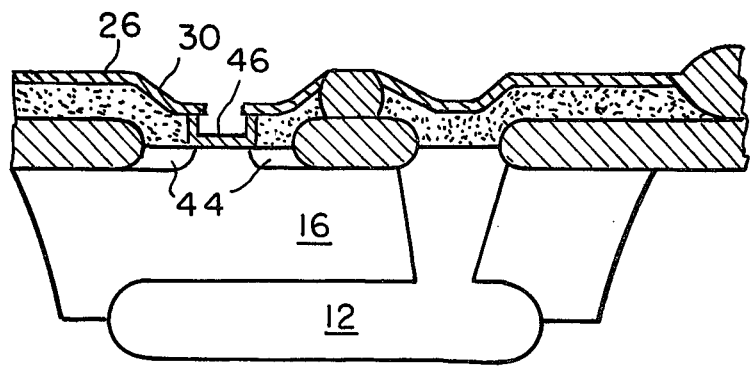

With the silicon nitride 32 eliminated, the oxide layer 30 is retained and, with the help of a resin mask which is not shown, it is etched to define an opening 36 corresponding to the position of the emitter and to the geometry thereof, enlarged by a few tenths of a micron (FIG. 5).

The resin is eliminated and the oxide cut out at the level of the emitter itself serves as a mask for chemical or plasma etching of the polycrystalline silicon at the level of opening 36.

The etching is substantially isotropic, that is to say that opening 38 formed in the polycrystalline silicon of layer 26 extends not only opposite opening 36, but also slightly recessed below the edges of the oxide layer 30 surrounding opening 36. The over-etching of the silicon with respect to the mask produces a slight overhang 40 of the oxide layer 30 with respect to the vertical edges 42 of the polycrystalline silicon around opening 36.

The etching is carried out so as to eliminate the polycrystalline silicon in opening 38 while not, or almost not etching, the monocrystalline silicon which is below. The duration of the etching operation is accordingly limited, depending on the polycrystalline silicon thickness and on the type of etching and on the etching products used.

FIG. 5 shows the semiconductor wafer at the end of this etching step.

Heat treatment in an oxidizing atmosphere is then carried out so as to obtain boron diffusion (P+) in the monocrystalline silicon from the boron doped polycrystalline silicon in contact with the epitaxial layer 16. The polycrystalline silicon behaves like a doping source and forms in the monocrystalline silicon a P+ type extrinsic base region 44 surrounding opening 38 formed in the polycrystalline silicon.

This latter forms a base electrode in contact with the extrinsic base region 44 and there is self-alignment between base contact and extrinsic base.

The treatment may be carried out in an oven at 1050° C. for 30 minutes. It leads to oxidization of the silicon which is laid bare, i.e. both the monocrystalline silicon in opening 38 and the vertical edges 42 of the polycrystalline silicon surrounding this opening. The thickness of the dish shaped oxide layer 46 which results from this oxidization may be of the order of 100 angströms.

Figure 7:
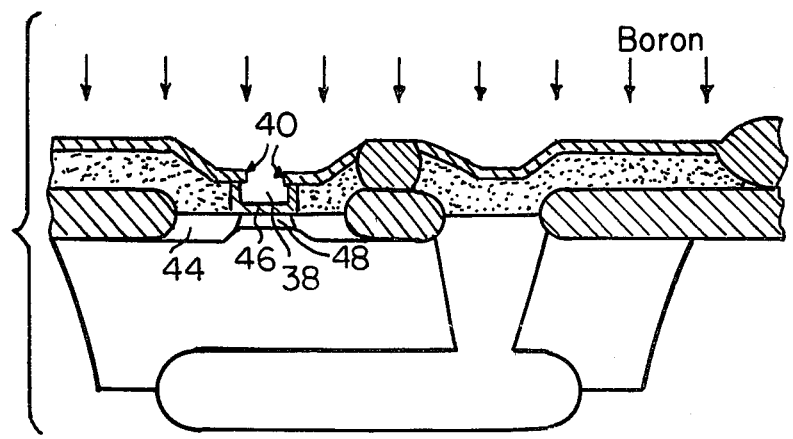

Ionic implantation of a P type impurity (boron) is then provided, for example with an energy of 100 kev and a dose of $10^{13}$ atoms per square centimeter (FIG. 7). This energy is sufficient for the boron atoms to pass through the oxide portion which remains overhanging in opening 38.

With this implantation there is formed the lightly doped intrinsic base 48 of the transistor which joins laterally the more heavily doped extrinsic layer 44, taking into account the lateral advance of the boron diffusion with respect to the polycrystalline silicon which has served as doping source.

It now remains to form an emitter region and an emitter contact which are self-aligned with respect to each other and with respect to the extrinsic base, so as to provide a small intrinsic base thickness between the emitter region and the extrinsic base. The following steps of the process show how this self-aligning is achieved by controlling the intrinsic base thickness which remains.

Figure 8:
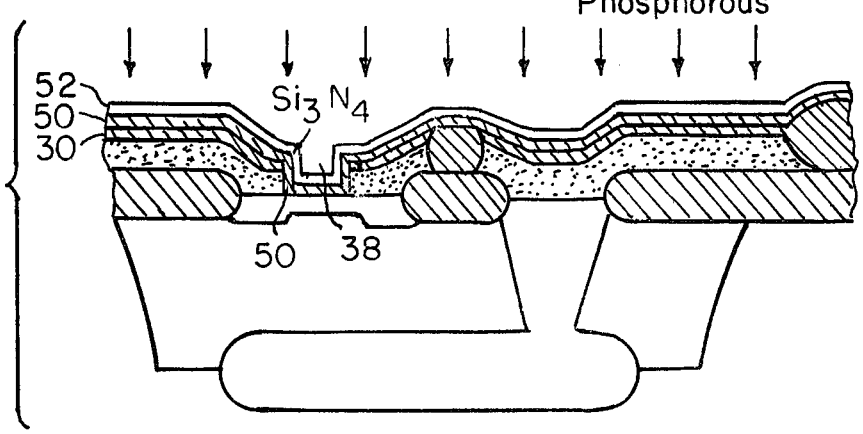

A silicon oxide layer 50 is deposited on the wafer, at low pressure, so as to cover the whole of the external surface thereof, including the vertical edges surrounding opening 38 (FIG. 8). This layer has a thickness of the order of 5000 angströms; this thickness may vary, for it is essentially thereby that the distance between emitter and extrinsic base is controlled. This layer 50 is superimposed over the major part of the surface of the wafer on the insulating layer 30, (in principle also made from silicon oxide) which is still present (and which has moreover increased slightly in thickness during the heat treatment at 1050° C. in an oxidizing atmosphere).

Then a silicon nitride layer 52 having a thickness of the order of 500 angströms is deposited, still at low pressure, so as to obtain good covering even on the vertical walls.

Implantation is then carried out of phosphorous or another product capable of increasing the dissolvability of the nitride in a subsequent step for etching the nitride.

With an implantation of $2 \times 10^{15}$ atoms/cm$^2$ of phosphorous at an energy of 50 kev, the etching speed of the nitride in a 10% FH-H20 solution is multiplied by 8. But the penetration of the phosphorous ions during implantation (which is made vertically) is very small at the level of the vertical portions of the nitride layer 52. Consequently, the dissolving rate is not increased in these portions and, because of the selectivity thus obtained and by suitably choosing the etching time for the nitride, the nitride may be entirely eliminated everywhere except on the vertical walls of the opening 38 formed in the polycrystalline silicon.

Figure 9:
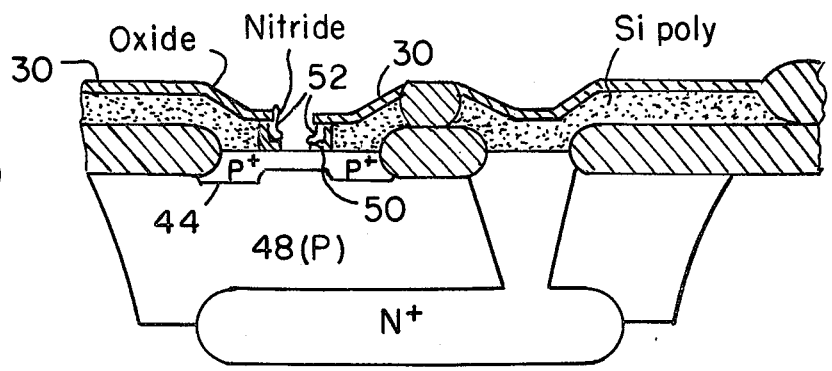

After this step of dissolving the nitride, the oxide 50 covering the wafer is etched, but only over a thickness sufficient for laying bare the monocrystalline silicon in opening 38, without going so far as to lay bare the polycrystalline silicon. This is easy, for the initially deposited oxide layer 30 was not present in opening 38 and so remains after elimination of layer 50. The oxide of layer 50 remains, however, where it is protected by the remaining portions of nitride. The bared monocrystalline silicon part has then shrunk with respect to opening 38 formed in the polycrystalline silicon, but it remains centered with respect to this opening. The shrinking corresponds broadly to the sum of the oxide and nitride thickness deposited after formation by implantation of the intrinsic base (of the order of 0.4 micron). The polycrystalline silicon 26 remains completely masked by the insulating layer 30 (oxide), care having been taken not to eliminate this latter when laying bare the monocrystalline silicon inside opening 38 (FIG. 9).

The emitter region and its contact may be formed. This could be by implantation or diffusion of phosphorous in opening 38, then deposition on the wafer included in this opening of a conductor which is then etched. It is preferable to deposit immediately a second uniform layer 54 of polycrystalline silicon which fills opening 38 by coming into contact with the monocrystalline silicon. This second layer is doped with phosphorous, for example (N+), either during deposition thereof, or after; in both cases, the second polycrystalline silicon layer 54 serves both as emitter contact and doping source for the monocrystalline silicon, where it is in contact with this latter, so that it creates an emitter region 56 which is aligned with its contact and, as was explained, centered with respect to the intrinsic base 44 and its contact.

Figure 10:
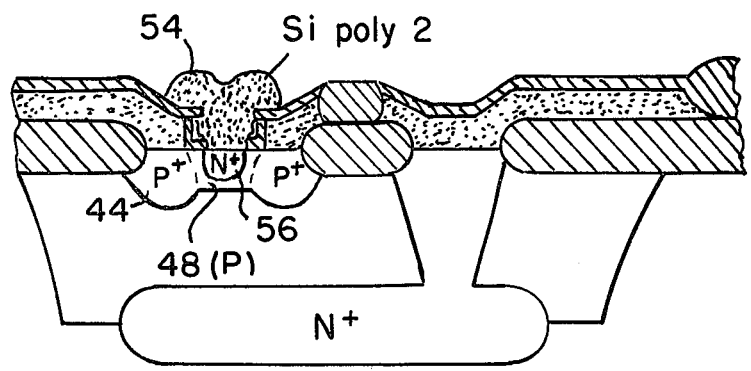

The second polycrystalline silicon layer 54 is plasma etched so as to define the emitter electrode as well as the interconnections (FIG. 10).

As was previously mentioned, before deposition of the second layer 54, the first layer 26 could be eliminated in the whole of region C (FIG. 4), i.e. in particular in the whole of the space between the thick oxide regions formed in the polycrystalline silicon 26. Thus, the second polycrystalline level 54 would also serve as collector contact and would therefore be etched accordingly.

Figure 11:
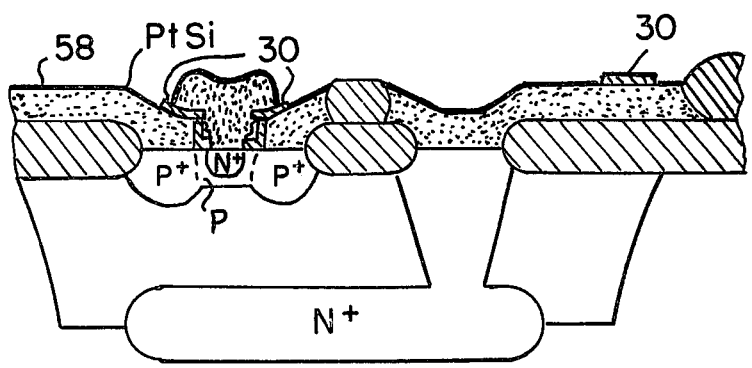
Figure 12:
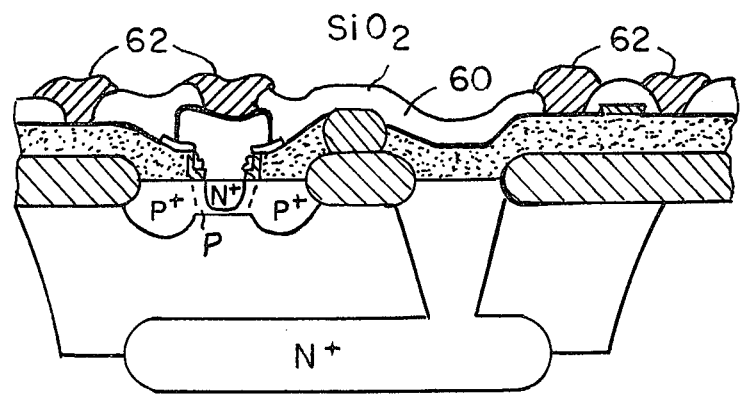

The process of the invention may then be continued by forming platinum silicide PtSi (58) on the interconnections after etching of the silica layer 30 (FIG. 11), so as to improve the conductibility of the interconnections. Then, after depositing and etching a silica layer 60 (FIG. 12), an aluminium layer 62 is deposited (which forms a third interconnection level) which is etched depending on the connections to be provided. A final passivation may be carried out.

Thus, very small transistors are formed (emitter with a side of 0.5 micron) which, in logic operation, allow propagation times of 0.25 nanosecond to be reached per gate with a merit factor of 0.15 picojoule, without these performances being related to the alignment accuracies of the masks.

Of course, PNP transistors may be formed by using the same technique and by reversing the types of conductivity mentioned in the description.

What is claimed is:

1. A process for manufacturing an integrated bipolar transistor of very small dimensions, wherein the steps of forming a base region and an emitter region of this transistor comprise:
   (a) formation, on a monocrystalline silicon layer containing impurities of a first type of conductivity, of a polycrystalline silicon layer doped above the base region with an impurity of a second type of conductivity opposite to said first type,
   (b) formation of an insulating layer on the polycrystalline silicon layer,
   (c) selective etching of the insulating layer and of the polycrystalline silicon layer above a region in the monocrystalline silicon layer which will constitute an intrinsic base region, said etching forming vertical edges in said polycrystalline silicon layer, said selective etching being continued until the monocrystalline silicon layer in said intrinsic base region is laid bare,
   (d) heat treatment for causing diffusion in the monocrystalline silicon layer of said impurity of the second type, so as to form in said monocrystalline silicon layer an extrinsic base region surrounding the intrinsic base region,
   (e) doping of the monocrystalline silicon layer in the intrinsic base region with an impurity of the second type of conductivity,
   (f) uniform deposition, by low pressure chemical vapor deposition, of a thin layer of silicon oxide,
   (g) uniform deposition onto said thin layer of silicon oxide, by low pressure chemical vapor deposition, of a thin layer of silicon nitride,
   (h) vertical ionic implantation, in the thin layer of silicon nitride, of an impurity capable of increasing the dissolution rate of said silicon nitride,
   (i) dissolution of the silicon nitride layer for a time sufficiently long to lay bare the monocrystalline silicon layer in the intrinsic base region but not long enough to eliminate the silicon nitride on the vertical edges of the polycrystalline silicon layer, and not enough to lay bare the polycrystalline silicon layer where it is still covered by said insulating layer formed in step b), and
   (j) doping, with an impurity of the first type of conductivity, of the monocrystalline silicon layer which has been laid bare, so as to form an emitter region.

2. The process as claimed in claim 1, wherein step (e) comprises ionic implantation.

3. The process as claimed in claim 1, wherein the silicon oxide layer deposited in step (f) and the silicon nitride layer deposited in step (g) have respective thicknesses of the order of 5000 angströms and 500 angströms.

4. The process as claimed in claim 1, wherein the impurity implanted in step (h) is phosphorous.

5. The process as claimed in claim 1 wherein the insulating layer formed in step (b) is a silicon oxide layer having a thickness of the order of 3000 angströms.

6. A process as in claim 1, wherein said formation step (a) includes the steps of:
   depositing a polycrystalline silicon layer onto a monocrystalline silicon epitaxial layer;
   etching, through the use of a selection mask, a protecting layer onto said polycrystalline silicon layer, said protecting layer protecting regions of said polycrystalline silicon layer other than the base region; and
   doping, with an impurity of the second type, the polycrystalline silicon layer, said areas of the polycrystalline silicon layer being protected from said doping by said protecting layer.

7. The process as claimed in claim 1, wherein step (c) includes the step of utilizing a mask defining an opening corresponding to the desired geometry of the emitter region, expanded by a few tenths of a micron.

8. A process as in claim 7, wherein said selective etching step (c) includes the step of applying plasma.

9. A process as in claim 7, wherein said selective etching step (c) includes the step of applying a chemical solution.

10. The process as claimed in claim 1, further comprising the steps of: deposition of a second polycrystalline silicon layer insulated from the first polycrystalline layer by remaining vertical portions of said silicon oxide layer deposited in step (f) and said silicon nitride layer deposited in step (g), the second layer coming into contact with the monocrystalline silicon layer laid bare in step (i), and etching of this second polycrystalline silicon layer.

11. The process as claimed in claim 10, wherein said doping step (j) includes the step of diffusing, through the second polycrystalline silicon layer, an impurity of the first type of conductivity so as to form, in the monocrystalline silicon layer where said monocrystalline silicon layer is in contact with the second polycrystalline silicon layer, an emitter region.

* * * * *